US006974657B2

(12) United States Patent
Berger et al.

(10) Patent No.: US 6,974,657 B2
(45) Date of Patent: Dec. 13, 2005

(54) COMPOSITIONS FOR MICROLITHOGRAPHY

(75) Inventors: Larry L. Berger, Chadds Ford, PA (US); Michael Karl Crawford, Glen Mills, PA (US); Jerald Feldman, Wilmington, DE (US); Lynda Kaye Johnson, Wilmington, DE (US); Frank Leonard Schadt, III, Wilmington, DE (US); Fredrick Claus Zumsteg, Jr., Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/380,922

(22) PCT Filed: Oct. 16, 2001

(86) PCT No.: PCT/US01/42743

§ 371 (c)(1),
(2), (4) Date: Mar. 18, 2003

(87) PCT Pub. No.: WO02/33489

PCT Pub. Date: Apr. 25, 2002

(65) Prior Publication Data

US 2004/0033436 A1 Feb. 19, 2004

Related U.S. Application Data

(60) Provisional application No. 60/325,780, filed on Oct. 18, 2000.

(51) Int. Cl.$^7$ .......................... G03F 7/038; G03F 7/039; C08F 232/08

(52) U.S. Cl. .................... 430/270.1; 430/905; 430/907; 430/322; 430/325; 526/281; 526/242

(58) Field of Search ............................. 430/270.1, 905, 430/907, 322, 325; 526/281, 242

(56) References Cited

U.S. PATENT DOCUMENTS

| | | | |
|---|---|---|---|
| 3,444,148 A | | 5/1969 | Adelman |
| 4,963,471 A | | 10/1990 | Trout et al. |
| 5,177,166 A | | 1/1993 | Kobo et al. |
| 5,229,473 A | | 7/1993 | Kobo et al. |
| 5,677,405 A | | 10/1997 | Goodall et al. |
| 5,693,452 A | * | 12/1997 | Aoai et al. ............... 430/270.1 |
| 5,929,181 A | | 7/1999 | Makovetsky et al. |

FOREIGN PATENT DOCUMENTS

| | | |
|---|---|---|
| WO | WO 9733198 | 9/1997 |
| WO | WO 0017712 | 3/2000 |

OTHER PUBLICATIONS

JP03281664 Abstract.
JP62186907 Abstract.
XP002211108 R. R. Kunz et al. "Outlook for 157 –nm Resist Design" Proceedings of the SPIE—The International Society for Optical Engineering vol. 3678, No. 1, Mar. 1999 pp. 13–23.
XP002211109 K. Patterson et al. "Polymers for 157 nm Photoresist Applications: A Progress Report" Proceedings of the SPIE—The International Society for Optical Engineering, vol. 2999, No. 1, Mar. 2000, pp. 365–374.
XP002209052 S. Cho et al., "Negative Tone 193 nm Resists" Proceedings of the SPIE—The International Society for Optical Engineering, vol. 3999, No. 1, Mar. 2000, pp. 62–72.
XP002211110 M. H. Somervell et al., "Using Alicyclic Polymers in Top Surface Imaging Systems to Reduce Line Edge Roughness" Proceedings of the SPIE—The International Society for Optical Engineering, vol. 3999, No. 1, Mar. 2000, pp. 270–282.
Introduction to Microlithography, Second Edition by L. F. Thompson, C.G. Willson, and M. J. Bowden, American Chemical Society, Washington, DC 1994.
F. M. Houlihan et al., Macromolecules, 30, pp. 6517–6534, 1997.
T. Wallow et al., SPIE, vol. 2724, pp. 355–364.
F. M. Houlihan et al., Journal of Photopolymer Science and Technology, 10, No. 3, pp. 511–520.
Okoroanyanwu et al., SPIE, vol. 3049, pp. 92–103.
R. Allen et al., SPIE, vol. 2724, pp. 334–343 "Protecting Groups for 193–nm Photoresists".
Semiconductor International, Sep. 1997, p. 74–80.
J. Niu and J. Frechet, Angew. Chem. Int. Ed., 37, No. 5, 1998, pp. 667–670.
"Synthesis and Evaluation of Alicyclic Backbone Polymers for 193 nm Lithography", Chapter 16, ACS Symposium Series 706 (Micro–and Nanopatterning Polymers, pp. 208–223, 1998.
H. Ito et al., Abstract in Polymeric Materials Science and Engineering Division, American Chemical Society Meeting, vol. 77, Fall Meeting, Sep. 8–11, 1997, Las Vegas, NV.
K. J. Przybilla et al., "Hexafluoroacetone in Resist Chemistry: A Versatile New Concept for Materials for Deep UV Lithography", SPIE vol. 1672, 1992, p. 500–512.

* cited by examiner

Primary Examiner—Yvette C. Thornton

(57) ABSTRACT

A fluorine-containing polymer prepared from at least a spacer group selected from the group consisting of ethylene, alpha-olefins, 1,1'-disubstituted olefins, vinyl alcohols, vinyl ethers, and 1,3-dienes; and a norbornyl radical containing a functional group containing the structure: $-C(R_f)(R_{f'})Or_b$ wherein $R_f$ and $R_{f'}$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group; r is an integer ranging from 0-4. The fluorine-containing polymer has an absorption coefficient of less than 4.0 mm$^{-1}$ at a wavelength of 157 nm. These polymers are useful in photoresist compositions for microlithography. They exhibit high transparency at this short wavelength and also possess other key properties, including good plasma etch resistance and adhesive properties.

2 Claims, No Drawings

COMPOSITIONS FOR MICROLITHOGRAPHY

This application claims the benefit of Provisional Application No. 60/325,780, filed on Oct. 18, 2000.

FIELD OF THE INVENTION

The present invention pertains to photoimaging and, in particular, the use of photoresists (positive-working and/or negative-working) for imaging in the production of semiconductor devices. The present invention also pertains to novel fluorine-containing polymer compositions having high UV transparency (particularly at short wavelengths, e.g., 157 nm) which are useful in photoresist compositions and antireflective coatings.

BACKGROUND OF THE INVENTION

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquines as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is a strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 micron for 157 nm imaging). Photolithography using 193 nm exposure wavelength (obtained from an argon fluorine (ArF) excimer laser) is a leading candidate for future microelectronics fabrication using 0.18 and 0.13 μm design rules. Photolithography using 157 nm exposure wavelength (obtained from a fluorine excimer laser) is a leading candidate for future microlithography further out on the time horizon (beyond 193 nm) provided suitable materials can be found having sufficient transparency and other required properties at this very short wavelength. The opacity of traditional near UV and far UV organic photoresists at 193 nm or shorter wavelengths precludes their use in single-layer schemes at these short wavelengths.

Some resist compositions suitable for imaging at 193 nm are known. For example, photoresist compositions comprising cycloolefin-maleic anhydride alternating copolymers have been shown to be useful for imaging of semiconductors at 193 nm (see F. M. Houlihan et al, *Macromolecules*, 30, pages 6517–6534(1997); T. Wallow et al. *SPIE*, Vol. 2724, pages 355–364; and F. M. Houlihan et al., *Journal of Photopolymer-Science and Technology*, 10, No. 3, pages 511–520 (1997)). Several publications are focused on 193 nm resists (i.e., U. Okoroanyanwu et al, *SPIE*, Vol. 3049, pages 92–103; R. Allen et al., *SPIE*, Vol. 2724, pages 334–343; and *Semiconductor International*, September 1997, pages 74–80). Compositions comprising addition polymers and/or ROMP (ring-opening methathesis polymerization) of functionalized norbornenes have been disclosed in PCT WO 97/33198. Homopolymers and maleic anhydride copolymers of norbornadiene and their use in 193 nm lithography have been disclosed (J. Niu and J. Frechet, Angew. *Chem. Int. Ed.*, 37, No. 5, (1998), pages 667–670). Copolymers of flourinated alcohol-substituted polycyclic ethylenically unsaturated comonomer and sulfur dioxide that are suitable for 193 nm lithography have been reported (see H. Ito et al., "Synthesis and Evaluation of Alicyclic Backbone Polymers for 193 nm Lithography", Chapter 16, ACS Symposium Series 706 (Micro- and Nanopatterning Polymers) pages 208–223 (1998) and H. Ito et al., Abstract in Polymeric Materials Science and Engineering Division, American Chemical Society Meeting, Volume 77, Fall Meeting, Sep. 8–11, 1997, held in Las Vegas, Nev.). Because of the presence of repeat units derived from sulfur dioxide in this alternating copolymer, it is not suitable for 157 nm lithography due to the excessively high absorption coefficient of this polymer at 157 nm.

Photoresists containing fluorinated alcohol functional groups attached to aromatic moieties have been disclosed (see K. J. Przybilla et al., "Hexafluoroacetone in Resist Chemistry: A Versatile New Concept for Materials for Deep UV Lithography", *SPIE* Vol. 1672, (1992), pages 500–512). While suitable for 248 nm lithography, these resists, because of the aromatic functionality contained in them, are unsuitable for lithography at 193 or 157 nm (due to the excessively high absorption coefficients of the aromatic resist components at these wavelengths).

Copolymers of fluoroolefin monomers and cyclic unsaturated monomers are disclosed in U.S. Pat. Nos. 5,177,166 and 5,229,473 which do not disclose photosensitive compositions. Copolymers of certain fluorinated olefins with certain vinyl esters are known. For example, the copolymer of trifluoroethylene (TFE) with cyclohexanecarboxylate, vinyl ester is disclosed in Japanese Patent Appln. JP 03281664. Copolymers of TFE and vinyl esters, such as vinyl acetate, and use of these copolymers in photosensitive compositions for refractive index imaging (e.g., holography) is disclosed in U.S. Pat. No. 4,963,471 to DuPont.

Copolymers of norbornene-type monomers containing functional groups with ethylene are disclosed in WO 98/56837 and copolymers of norbornene-type monomers containing functional groups with vinyl ethers, dienes, and isobutylene, are disclosed in U.S. Pat. No. 5,677,405. Norbornene/ethylene copolymerizations catalyzed by nickel catalysts are disclosed in U.S. Pat. No. 5,929,181.

Certain copolymers of fluorinated alcohol comonomers with other comonomers are disclosed in U.S. Pat. No. 3,444,148 and JP 62186907 A2. These patents are directed to membrane or other non-photosensitive films or fibers, and neither has any teaching of fluorinated alcohol comonomers use in photosensitive layers (e.g., resists), U.S. Pat. No. 5,655,627 discloses a process for generating a negative tone resist image by coating a silicon wafer with a copolymer resist solution of pentafluoropropyl methacrylate-t-butyl methacrylate in a solvent, and then exposing at 193 nm and developing with a carbon dioxide critical fluid.

A need still exists for resist compositions that satisfy the myriad of requirements for single layer photoresists that include optical transparency at 193 nm and/or 157 nm, plasma etch resistance, and solubility in an aqueous base developer.

In the process of forming patterned microelectronic structures by means of lithography, it is common in the art to use one or more antireflective coatings (ARC) or layers either beneath the photoresist layer, a BARC, or on top of the photoresist layer, a TARC, (or sometimes referred to simply as an ARC) or both. Antireflective coating layers have been shown to reduce the deleterious effects of film thickness variations and the resulting standing waves caused by the interference of light reflecting from various interfaces within the photoresist structure and the variations in the exposure dose in the photoresist layer due to loss of the reflected light. The use of these antireflective coating layers results in improved patterning and resolution characteristics of the photoresist materials because they suppress reflection related effects.

A need also exists for antireflective coatings that have optical transparency at 193 nm and/or 157 nm.

SUMMARY OF THE INVENTION

The invention relates to a fluorine-containing polymer comprising the reaction product of (A) a spacer group and (B) a repeat unit derived from a monomer containing a norbornyl radical and a functional group containing the structure:

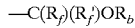

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group.

In a first aspect, the invention provides a fluorine-containing polymer prepared from at least (A) a spacer group selected from the group consisting of ethylene, alpha-olefins, 1,1'-disubstituted olefins, vinyl alcohols, vinyl ethers, and 1,3-dienes; and (B) a repeat unit derived from a monomer having the following structure:

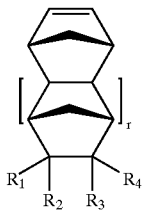

wherein each of $R_1$, $R_2$, $R_3$, and $R_4$ independently is hydrogen, a halogen atom, a hydrocarbon group containing from 1 to 10 carbon atoms, a substituted hydrocarbon group, an alkoxy group, a carboxylic acid, a carboxylic ester or a functional group containing the structure:

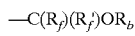

wherein $R_f$ and $R_f'$ are the same or different fluoroalkyl groups of from 1 to 10 carbon atoms or taken together are $(CF_2)_n$ wherein n is 2 to 10; $R_b$ is hydrogen or an acid- or base-labile protecting group; r is 0–4; at least one of the repeat units (B) has a structure whereby at least one of $R_1$, $R_2$, $R_3$, and $R_4$ contains the structure $C(R_f)(R_f')OR_b$.

In a second aspect, the invention provides a photoresist composition comprising a fluorine-containing polymer comprising the reaction product of (A) a spacer group and (B) a repeat unit derived from a monomer containing a norbornyl radical and a functional group containing the structure:

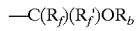

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group; and (b) at least one photoactive component wherein the fluorine-containing polymer has an absorption coefficient of less than 4.0 $\mu m^{-1}$ at a wavelength of 157 nm.

In a third aspect, the invention provides a process for preparing a photoresist image on a substrate comprising, in order:

(X) imagewise exposing the photoresist layer to form imaged and non-imaged areas, wherein the photoresist layer is prepared from a photoresist composition comprising:

(a) fluorine-containing polymer prepared from at least a fluorine-containing polymer comprising the reaction product of (A) a spacer group and (B) a monomer containing a norbornyl radical and a functional group containing the structure:

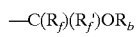

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group; and (b) a photoactive component wherein the fluorine-containing polymer has an absorption coefficient of less than 4.0 $\mu m^{-1}$ at a wavelength of 157 nm; and (Y) developing the exposed photoresist layer having imaged and non-imaged areas to form the relief image on the substrate.

In a fourth aspect, the invention provides for an element comprising a support, and at least an antireflection layer; wherein the antireflection layer is prepared from a composition comprising at least one fluorine-containing polymer prepared from at least a fluorine-containing reaction product of (A) a spacer group and (B) a monomer containing a norbornyl radical and a functional group containing the structure:

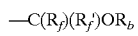

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group.

The element may further comprise a photoresist layer.

In a fifth aspect, the invention provides a process for improved lithographic patterning of a photoresist element having a support, a photoresist layer and an antireflection layer comprising:

(Y) imagewise exposing the photoresist element to form imaged and non-imaged areas, wherein the antireflection layer is prepared from a composition comprising at least one fluorine-containing polymer prepared from at least a fluorine-containing polymer comprising the reaction product of (A) a spacer group and (B) a monomer containing a norbornyl radical and a functional group containing the structure:

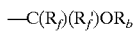

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group; and (Z) developing the exposed photoresist element having imaged and non-imaged areas to form the relief image on the substrate.

DETAILED DESCRIPTION

The fluorine-containing polymers of the invention are prepared from at least a fluorine-containing polymer comprising the reaction product of (A) a spacer group and (B) a monomer containing a norbornyl radical and a functional group containing the structure:

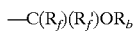

wherein $R_f$ and $R_f'$ are the same or different fluoroalkyl groups of from 1 to about 10 carbon atoms or taken together are $(CF_2)_n$ wherein n is an integer ranging from 2 to about 10 and $R_b$ is a hydrogen atom or an acid- or base-labile protecting group.

Fluorine-Containing Polymer:

The fluorine-containing polymer is prepared from at least a spacer group (A) and a monomer (B).

The spacer group is a hydrocarbon compound containing vinylic unsaturation and optionally, containing at least one heteroatom, such as an oxygen atom or a nitrogen atom. The hydrocarbon compound contemplated as the spacer group contains, typically, 2 to 10, more typically 2 to 6 carbon atoms. The hydrocarbon may be straight chain or branched chain. Specific examples of suitable spacer groups are selected from the group consisting of ethylene, alpha-olefins, 1,1'-disubstituted olefins, vinyl alcohols, vinyl ethers, and 1,3-dienes. Typically, when the spacer group is an alpha olefin, it is selected from the group consisting of ethylene, propaylene, 1-butene, 1-pentene, 1-hexene and 1-octene. Typically, when the spacer group is a vinyl ether it is selected from the group consisting of methyl vinyl ether and ethyl vinyl ether. Typically vinyl alcohols can be obtained by post-polymerization hydrolysis of a functional group already incorporated into the polymer backbone, e.g. the acetate group of vinyl acetate. Typically when the spacer group is a 1,3-diene it is butadiene. Typically when the spacer group is a 1,1'-disubstituted olefin it is isobutylene or isopentene.

Monomer (B) is an ethylenically unsaturated compound containing a norbornyl radical and a fluoroalcohol functional group.

These fluoroalkyl groups are designated as $R_f$ and $R_f'$, which can be partially fluorinated alkyl groups or fully fluorinated alkyl groups (i.e., perfluoroalkyl groups).

Broadly, $R_f$ and $R_f'$ are the same or different fluoroalkyl groups of from 1 to about 10 carbon atoms or taken together are $(CF_2)_n$ wherein n is an integer ranging from 2 to about 10.

The terms "taken together" mean that $R_f$ and $R_f'$ are not separate, discrete-fluorinated alkyl groups, but that together they form a ring structure of 3 to about 11 carbon atoms such as is illustrated below in case of a 5-membered ring:

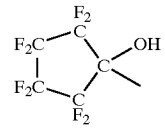

When $R_f$ and $R_f'$ are partially fluorinated alkyl groups there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. Typically, there will be sufficient fluorine substitution present in the fluorinated alkyl groups of the fluoroalcohol functional group such that the hydroxyl group will have a pKa value as follows: $5<pKa<11$.

Preferably, $R_f$ and $R_f'$ are independently perfluoroalkyl group of 1 to about 5 carbon atoms, and, most preferably, $R_f$ and $R_f'$ are both trifluoromethyl ($CF_3$).

In a repeat unit derived from a monomer having the structure

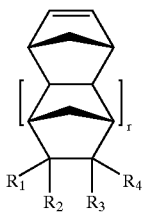

the substituents $R_1$, $R_2$, $R_3$, and $R_4$ may, independently, be a hydrogen atom, a halogen atom, a hydrocarbon group containing from 1 to about 10 carbon atoms or a substituted hydrocarbon group. When one or more substituent $R_1$, $R_2$, $R_3$, and $R_4$ is a hydrocarbon group the carbon atoms are usually straight chain or branched chain. Typical examples include alkyl groups (methyl ("Me"), ethyl ("Et"), propyl ("Pr")), carboxylic acid or ester, alkoxy (—OMe, OEt, OPr), halogen (F, Cl, Br). When one or more substituent $R_1$, $R_2$, $R_3$, and $R_4$ is a substituted hydrocarbon group, the substituent is typically a heteroatom selected from the group consisting of oxygen atom, typically to form an alkoxy group, a carboxylic acid group or a carboxylic ester group.

Copolymers of ethylene and monomers of the formula

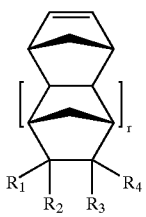

may contain "abnormal" branching (see for example World Patent Application 96/23010, which is hereby incorporated by reference, for an explanation of "abnormal" branching). These polymers may typically contain more than 5 methyl ended branches per 1000 methylene groups in polyethylene segments in the polymer, more typically more than 10 methyl ended branches, and most typically more than 20 methyl ended branches. The branches can impart improved solubility to the ethylene copolymers which can be advantageous for preparing photoresists and for other purposes. Branching levels may be determined by NMR spectroscopy, see for instance World Patent Application 96/23010 and other known references for determining branching in polyolefins. By methyl ended branches are meant the number of methyl groups corrected for methyl groups present as end groups in the polymer. Also not included as methyl ended branches are groups which are bound to a norbornane ring system as a side group, for example a methyl attached directly to a carbon atom which is bound to a ring atom of a norbornane ring system. These corrections are well known in the art. Typically, polymers herein contain at least one mole percent (based on the total number of all repeat units in the copolymer) of the norbornene monomer shown above, more typically at least 2 mole percent, and most typically at least 5 mole percent. Repeat units derived from one or more other copolymerizable monomers, such as alpha-olefins and vinyl ethers may also optionally be present.

The free radical polymerization or metal-catalyzed vinyl addition polymerization processes employed in making the polymerization products of this invention are accomplished by such polymerization mechanisms known in the art to afford a polymer having a repeat unit that is derived from the ethylenically unsaturated compound. Specifically, an ethylenically unsaturated compound having structure:

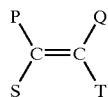

that undergoes free radical polymerization will afford a polymer having a repeat unit:

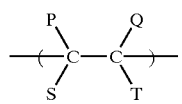

where P, Q, S, and T independently can be the same or different and illustratively could be fluorine, hydrogen, chlorine, and trifluoromethyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

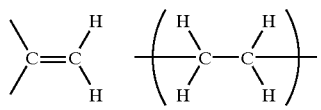

 

For metal catalyzed vinyl addition polymerization a useful catalyst is a nickel containing complex. Neutral Ni catalysts used in the patent are described in WO Patent Application 9830609. Other references regarding the salicylaldimine-based neutral nickel catalysts include WO Patent Application 9842664. Wang, C.; Friedrich, S.; Younkin, T. R.; Li, R. T.; Grubbs, R. H.; Bansleben, D. A.; Day, M. W. *Organometallics* 198, 17(15), 314 and Younkin, T.; Connor, E. G.; Henderson, J. I.; Friedrich, S. K.; Grubbs, R. H.; Bansleben, D. A. *Science* 2000, 287, 460–462. Additional catalysts are disclosed in Ittel, S. D.; Johnson, L. K.; Brookhart, M. *Chem. Rev.* 2000, 100, 1169–1203 and Boffa, L. S.; Novak, B. M. *Chem. Rev.* 2000, 100, 1479–1493. Moody, L. S.; MacKenzie, P. B.; Killian, C. M.; Lavoie, G. G.; Ponasik, J. A.; Barrett, A. G. M.; Smith, T. W.; Pearson, J. C. WO 0050470 discloses improvements variations of largely existing ligands and some new ligands on late metal catalysts, e.g., ligands derived from pyrrole amines instead of anilines and also ligands based on anilines with 2,6-ortho substituents where these ortho substituents are both aryl groups or any aromatic group. Specific examples would be alpha-diimine-based nickel catalysts and salicylaldimine-based nickel catalysts derived from the pyrrole amines and ortho-aromatic-substituted anilines. Some of these derivatives show improved lifetimes/activities/productivities/hydrogen response/potential functional group tolerance, etc. Another useful catalyst is a functional group tolerant, late metal catalyst usually based on Ni(II) or Pd(II). Useful catalysts are disclosed in WO 98/56837 and U.S. Pat. No. 5,677,405.

Methods of preparing copolymers from norbornene-type monomers and cationically polymerizable monomers by employing Group VIII transition metal ion sources for said monomers at a temperature in the range from –100° C. to 120° C. are disclosed in U.S. Pat. No. 5,677,405. By "cationically polymerizable monomers" what is meant are monomers such as olefins, isoolefins, branched α-olefins, vinyl ethers, cyclic ethers, and lactones that normally undergo cationic polymerization. The copolymers formed from norbornene-type monomers and cationically polymerizable monomers have a relatively high norbornene content (~80 mole % in those copolymers that are characterized). Copolymers can be formed using functionalized norbornene comonomers, e.g. 5-norbornene-2-methanol and esters derived from 5-norbornene-2-methanol. It is contemplated that the catalysts and methods disclosed in this application will be suitable for the synthesis of the copolymers of norbornene fluoroalcohols with 1,3-dienes, 1,1'-disubstituted olefins, and vinyl ethers that are the subject of the present invention. It is further contemplated that these copolymers may contain greater than approximately 1 mole %, more typically greater than approximately 25 mole %, and most typically greater than approximately 50 mole % of norbornene fluoroalcohol, with suitable adjustment of the monomer feed ratio. Examples of suitable catalysts useful in the preparation of such copolymers include norbornadiene-palladium dichloride/silver hexafluoroantimonate, methoxynorbornenylpalladium chloride dimer/silver hexafluoroantimonate, and [(η-crotyl)(cycloocta-1,5-diene) nickel]-hexafluorophosphate.

It is contemplated that in photoresist applications that the copolymer can include acidic groups, which may or may not be protected with acid-labile protecting groups. It is further contemplated that monomer units containing these acidic groups constitute greater than approximately 1 mole %, more typically greater than approximately 25 mole %, and most typically greater than approximately 50 mole % of the polymer. Examples of acidic groups include carboxylic acids, phenols, and fluroalcohols with pKa values of approximately 9 or less.

Copolymers of ethylene and protected norbornene fluoroalcohols can be synthesized using Ziegler-Natta and metallocene catalysts based on early transition metals. Suitable protecting groups for fluoroalcohols include alpha-alkoxy ethers. Examples of suitable catalysts may be found in the following references: W. Kaminsky J. *Chem. Soc., Dalton Trans.* 1988, 1413, and W. Kaminsky *Catalysis Today* 1994, 20, 257.

Any suitable polymerization conditions may be employed in the process of making the polymer. Typically, when metal catalyzed vinyl addition polymerization is used the temperatures are held below about 200° C., typically between 0° C. and 160° C. Suitable known solvents may be used such as trichlorobenzene or p-xylene.

Each fluorine-containing copolymer according to this invention has an absorption coefficient of less than 4.0 $\mu m^{-1}$ at a wavelength of 157 nm, preferably of less than 3.5 $\mu m^{-1}$ at this wavelength, more preferably, of less than 3.0 $\mu m^{-1}$ at this wavelength, and, still more preferably, of less than 2.5 $\mu m^{-1}$ at this wavelength.

Some illustrative, but nonlimiting, examples of representative comonomers containing a fluoroalcohol functional group and within the scope of the invention are presented below:

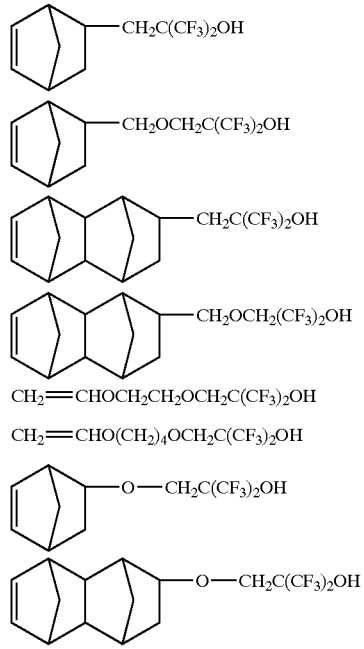

The fluorine-containing polymer may be photactive, i.e. the photoactive component may be chemically bonded to the fluorine-containing polymer. This may be accomplished by chemically bonding the photoactive component to a monomer which then undergoes copolymerization to the monomers (A) and (B) of the present invention, thus eliminating the need for a separate photoactive component.

The ratio of A and B can be important. Typical ranges for each are about 30% to about 70%.

One or more additional monomers (C) may be used in the preparation of the fluorine-containing polymers of the invention. In general, it is contemplated that an acrylate monomer may be suitable as a monomer (C) in preparing the polymers of the invention. Typical additional monomers include acrylates, olefins containing electron-withdrawing groups (other than fluorine) directly attached to the double bond. These polymers, typically terpolymers, may be made by free-radical polymerization, for example, acrylonitrile, vinyl chloride, vinylidene chloride. Alternately, olefins containing aromatic groups attached directly to the double bond; e.g. styrene and alpha-methyl styrene (although arguably these are alpha- and 1,1'-disubstituted olefins) are also useful. Vinyl acetate is also useful as an additional monomer.

These fluorine-containing polymers are useful in preparing photoresist compositions that comprise the fluorine-containing polymer, at least one photoactive component and optionally a dissolution inhibitor. The photoactive component may be chemically bonded to the fluorine-containing polymer or it may be a separate component used in combination with the fluorine-containing polymer.

Photoactive Component (PAC)

If the fluorine-containing polymer is not photoactive, the compositions of this invention may contain a photoactive component (PAC) that is not chemically bonded to the fluorine-containing polymer, i.e. the photoactive component is a separate component in the composition. The photoactive component usually is a compound that produces either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

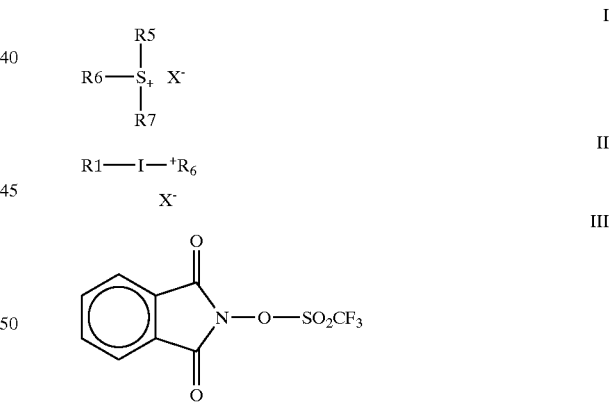

In structures I–II, $R_5$–$R_7$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures I–II can be, but is not limited to, $SbF_6^-$ (hexafluoroantimonate), $CF_3SO_3^-$ (trifluoromethylsulfonate=triflate), and $C_4F_9SO_3^-$ (perfluorobutylsulfonate):

Dissolution Inhibitor

Various dissolution inhibitors can be utilized in this invention. Ideally, dissolution inhibitors (DIs) for the far and extreme UV resists (e.g., 193 nm resists) are designed/ chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983, 130, 1433–1437.) Bile-salt esters are particularly attractive choices as DIs for several reasons, including their availability from natural sources, their possessing a high alicyclic carbon content, and particularly for their being transparent in the Deep and vacuum UV region of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII–IX, are preferred dissolution inhibitors in this invention.

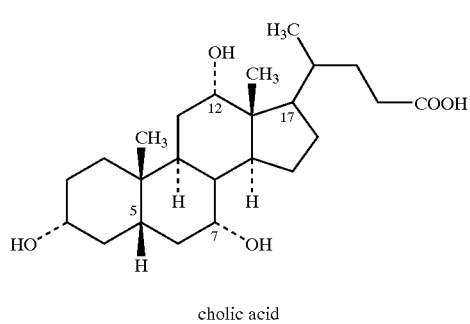

cholic acid

IV

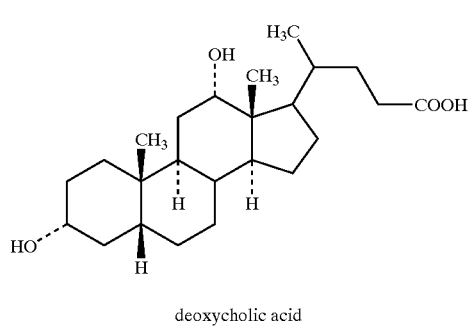

deoxycholic acid

V

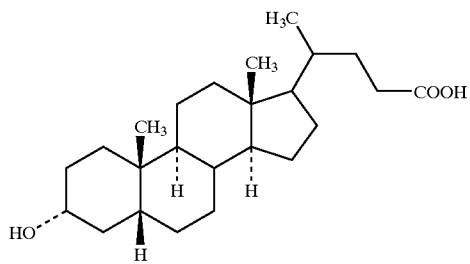

lithocholic acid

VI

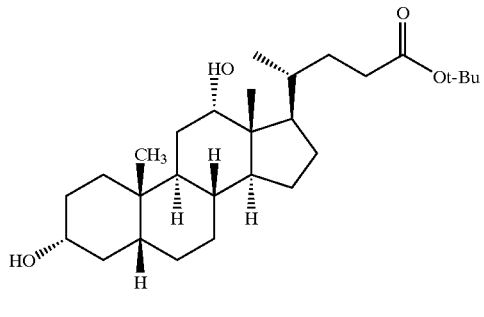

t-butyl deoxycholate

VII

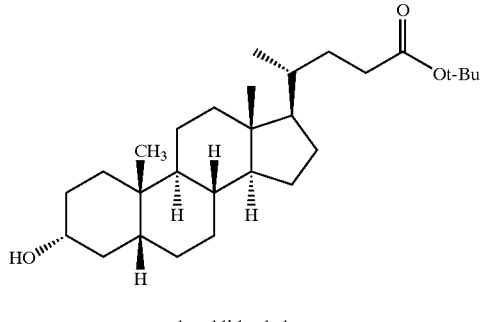

t-butyl lithocholate

VIII

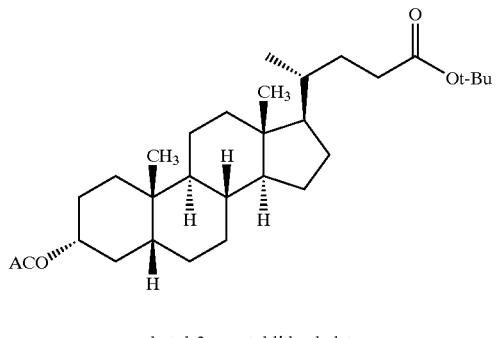

t-butyl-3α-acetyl lithocholate

IX

The amount of dissolution inhibitor can vary depending upon the choice of polymer. When the polymer lacks sufficient protected acid group for suitable image forming a dissolution inhibitor can be used to enhance the image forming properties of the photoresist composition.

Other Components

The compositions of this invention can contain optional additional components. Examples of additional components which can be added include, but are not limited to, resolution enhancers, adhesion promoters, residue reducers, coating aids, plasticizers, solvents and $T_g$ (glass transition temperature) modifiers. Crosslinking agents may also be present in negative-working resist compositions. Some typical crosslinking agents include bis-azides, such as, 4,4'-diazidodiphenyl sulfide and 3,3'-diazidodiphenyl sulfone. Typically, a negative working composition containing at least one crosslinking agent also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution. Examples of suitable solvents are 2-heptanone, trichlorobenzene, methanol, 1,1,2,2-tetrachloroethane, $d_2$ ethyl ether and p-xylene.

Process for Forming a Photoresist Image

The process for preparing a photoresist image on a substrate comprises, in order:

(X) imagewise exposing the photoresist layer to form imaged and non-imaged areas, wherein the photoresist layer is prepared from a photoresist composition comprising:

(a) fluorine-containing polymer of the invention; and (b) at least one photoactive component; and (Y) developing the exposed photoresist layer having imaged and non-imaged areas to form the relief image on the substrate.

Imagewise Exposure

The photoresist layer is prepared by applying a photoresist composition onto a substrate and drying to remove the solvent. The so formed photoresist layer is sensitive in the ultraviolet region of the electromagnetic spectrum and especially to those wavelengths less than or equal to about 365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine ($F_2$) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The fluorine-containing components in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution.

The fluorine-containing polymers in the resist compositions of this invention are typically acid-containing materials comprised of at least one fluoroalcohol-containing monomer of structural unit:

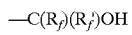

wherein $R_f$ and $R_f'$ are as previously described. The level of acidic fluoroalcohol groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., fluoroalcohol groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds, typically less than 90 seconds and in some instances less than 5 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmosphers below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are typical and fluorinated solvents are more typical.

Substrate

The substrate employed in this invention can illustratively be silicon, silicon oxide, silicon nitride, or various other materials used in semiconductive manufacture.

Other Applications

Many of the polymers discussed within this application could be used as antireflection layers for semiconductor lithography. In particular, since low optical absorption at 157 nm is a prime attribute of the materials being considered here, they should be of particularly utility at this wavelength.

Such layers may be applied using many different techniques such as spin coating, chemical vapor deposition and aerosol deposition. The design of a composition for use as an antireflective layer is well known to those skilled in the art. The primary optical properties of the material being used for the antireflective coating that must be considered are the optical absorption and the index of refraction, the fluorine-containing polymer of this invention possesses such properties.

For this application, the invention provides an element comprising a support, and at least an antireflection layer; wherein the antireflection layer is prepared from a composition comprising (a) a fluorine-containing polymer of this invention; and (b) at least one photoactive component The element may further comprise a photoresist layer.

The invention also provides a process for improved lithographic patterning of a photoresist element having a support, a photoresist layer and an antireflection layer comprising:

(Y) imagewise exposing the photoresist element to form imaged and non-imaged areas; wherein the antireflection layer is prepared from a composition comprising a fluorine-containing polymer of this invention; and (Z) developing the exposed photoresist element having imaged and non-imaged areas to form the relief image on the substrate.

The imaging and development steps are conducted as described earlier. The antireflection layer may be removed during the development of the photoresist having imaged and non-imaged areas or it may be removed separately using aqueous or solvent development, or by conventional dry etch processes as are know in the art. The photoresist layer may be any photoresist layer know to one skilled in the art with the proviso that it has an absorption coefficient of less than 4.0 $\mu m^{-1}$ at a wavelength of 157 nm. The fluorine-containing polymer has been described in detail earlier in the specification. The antireflection layer may be present between the support and the photoresist layer or it may be present on the surface of the photoresist layer away from the support.

All of the copolymers herein are also useful as molding resins (if thermoplastics) or as elastomers (if elastomeric). Polymers containing

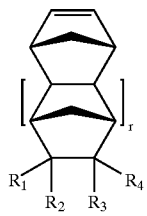

will also often have modified surface properties, for example be relatively hydrophobic because of the fluorine atoms present on the norbornene-type monomer, or if a hydrophilic group such as hydroxyl is present in the first monomer the surface may be relatively hydrophilic. These copolymers are also useful in polymer blends, particularly as compatibilizers between different types of polymers, for example ethylene copolymers of this invention may compatibilize blends of polyolefins such as polyethylene and more polar polymers such as poly(meth)acrylates, polyesters, or polyamides.

EXAMPLES

Abbreviations:
 Me: Methyl
 Et: Ethyl
 Hex: Hexyl
 Am: Amyl
 Bu: Butyl
 Eoc: End-of-chain
 p: Para
 M.W.: Molecular Weight
 Total Me: Total number of methyl groups per 1000 methylene groups as determined by $^1$H or $^{13}$C NMR analysis
 Cmpd: Compound
 mL: Milliliter
 Press: Pressure
 Temp: Temperature
 Incorp: Incorporation
 BAF=B(3,5-$C_6H_3$—$(CF_3)_2)_4^-$
 Nd: Not Determined
 GPC: Gel Permeation Chromatography
 TCB: 1,2,4-Trichlorobenzene
 THF: Tetrahydrofuran
 Rt: Room Temperatures
 Equiv: Equivalent
 MI: Melt Index
 RI: Refractive Index
 UV: Ultraviolet
 $M_w$: Weight Average Molecular Weight
 $M_n$: Number Average Molecular Weight
 $M_p$: Peak Average Molecular Weight
 PDI: Polydispersity; $M_w$ divided by $M_n$
 NMR: Nuclear Magnetic Resonance
 E: Ethylene
 g: gram
 h: Hour
 mol: Mole
 mmol: Millimole
 $Et_2O$: Diethyl Ether General Information Regarding Catalyst Syntheses:
 Methods for the synthesis of catalysts A through D, which are used in Examples 1–6, can be found in WO 98/30609.

Procedure for Examples 1, 2 and 3:

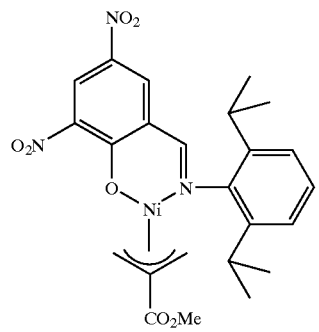

A

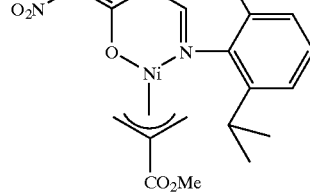

B

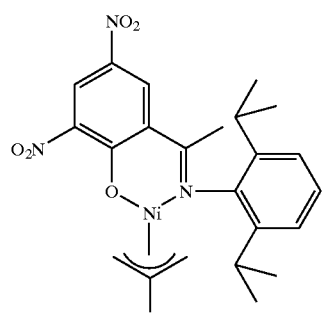

C

-continued

Norbornene-HFIP

In a nitrogen-purged drybox, a glass insert with a gas inlet was loaded with 0.02 mmol of the nickel complex A, B, or C and 40 equiv (0.4095 g) of $B(C_6F_5)_3$. Trichlorobenzene (9 ml) was added to the glass insert, which was then cooled to −30° C. in the drybox freezer. Norbornene-HFIP (1.52 g) was dissolved in 1 mL of $Et_2O$ and the resulting solution was added on top of the frozen trichlorobenzene. The insert was immediately cooled again in the −30° C. drybox freezer. The gas inlet of the cold insert was covered with electrical tape and the insert was sealed with a greased cap and removed from the drybox atmosphere. Outside of the drybox, the tube was placed in a plastic bag. The bag was sealed, placed in a bucket and surrounded with dry ice. After removing the electrical tape, the glass insert was transferred to a pressure tube. The pressure tube was sealed, evacuated, placed under ethylene (300 psi) and shaken mechanically for approximately 18 h at room temperature (rt). Following the completion of the reaction, methanol (~20 mL) was added to the glass insert in order to precipitate the polymer. The copolymer was isolated and dried under vacuum. $^1H$ NMR spectra were obtained at 113° C. in $TCE-d_2$ (1,1,2,2-tetrachloroethane-d2) using a Bruker 500 MHz spectrometer. $^{13}C$ NMR spectra were obtained unlocked at 140° C. using 310 mg of sample and 60 mg CrAcAc (chromium(III) acetylacetonatein a total volume of 3.1 mL TCB (trichlorobenzene) using a Varian Unity 400 NMR spectrometer with a 10 mm probe. GPC molecular weights are reported versus polystyrene standards; conditions: Waters 150° C., trichlorobenzene at 150 ° C., Shodex columns at −806MS 4G 734/602005, RI detector.

Example 1

Nickel complex A (0.0102 g) was used and the above general procedure was followed. The resulting copolymer of ethylene and norbornene-HFIP was isolated as 2.77 g of a white powder. $^1H$ NMR: 1.5 mole % norbornene-HFIP incorporated; $M_n$~3,120; 33.3 total methyl-ended branches per 1000 $CH_2$. $^{13}C$ NMR: 1.4 mole % norbornene-HFIP incorporated. GPC: Bimodal distribution with a small amount of higher molecular weight material present: $M_p$=1,581; $M_w$=19,873; $M_n$=1,118 and $M_p$=64,787; $M_w$=94,613 and $M_n$=55,595.

Example 2

Nickel complex B (0.0106 g) was used and the above general procedure was followed. The resulting copolymer of ethylene and norbornene-HFIP was isolated as 3.11 g of a white powder. $^1H$ NMR: 0.8 mole % norbornene-HFIP incorporated; $M_n$~18,040, 42.9total methyl-ended branches per 1000 $CH_2$. $^{13}C$ NMR: 0.92 mole % norbornene-HFIP incorporated.

Example 3

Nickel complex C (0.0094 g) was used and the above general procedure was followed. The resulting copolymer of ethylene and norbornene-HFIP was isolated as 1.01 g of a white powder. $^1H$ NMR: 0.3 mole % norbornene-HFIP incorporated; $M_n$~9,240; 29.1 total methyl-ended branches per 1000 $CH_2$. $^{13}C$ NMR: 0.33 mole % norbornene-HFIP incorporated.

Procedure for Examples 4 and 5

In a nitrogen-purged drybox, a glass insert with a gas inlet was

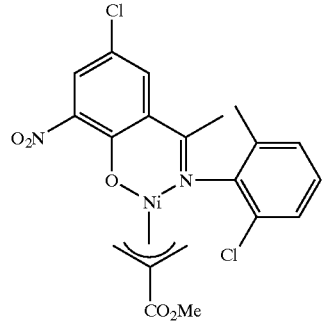

D loaded with 0.04 mmol of the nickel complex A or D and 20 equiv (0.4095 g) of $B(C_6F_5)_3$. Trichlorobenzene (9 mL) was added to the glass insert, which was then cooled to −30° C. in the drybox freezer. Norbornene-HFIP (1 mL) was dissolved in 1 mL of $Et_2O$ and the resulting solution was added on top of the frozen trichlorobenzene. The insert was immediately cooled again in the −30° C. drybox freezer. The gas inlet of the cold insert was covered with electrical tape and the insert was sealed with a greased cap and removed from the drybox atmosphere. Outside of the drybox, the tube was placed in a plastic bag. The bag was sealed, placed in a bucket and surrounded with dry ice. After removing the electrical tape, the glass insert was transferred to a pressure tube. The pressure tube was sealed, evacuated, placed under ethylene 150 psi) and shaken mechanically for approximately 18 h at rt. Following the completion of the reaction, methanol (~20 mL) was added to the glass insert in order to precipitate the polymer. The copolymer was isolated and dried under vacuum. $^{13}C$ NMR spectra were obtained unlocked at 140° C. using 310 mg of sample and 60 mg CrAcAc in a total volume of 3.1 mL TCB using a Varian Unity 400 NMR spectrometer with a 10 mm probe.

Example 4

Nickel complex A (0.0211 g) was used and the above general procedure was followed. The resulting branched copolymer of ethylene and norbornene-HFIP was isolated as 2.60 g of a white powder. $^{13}C$ NMR: 0.83 mole % norbornene-HFIP incorporated.

Example 5

Nickel complex D (0.0204 g) was used and the above general procedure was followed. The resulting branched copolymer of ethylene and norbornene-HFIP was isolated as 3.58 g of a white powder. $^{13}C$ NMR: 0.59 mole % norbornene-HFIP incorporated.

Example 6

In a nitrogen-purged drybox, a glass insert with a gas inlet was loaded with 0.04 mmol of the nickel complex B (0.0205 g) and 20 equiv (0.4095 g) of $B(C_6F_5)_3$. p-Xylene (8 mL) was added to the glass insert, which was then cooled to −30° C. in the drybox freezer. Norbornene-HFIP (2 mL) was dissolved in 1 mL of $Et_2O$ and the resulting solution was added on top of the frozen p-xylene. The insert was immediately cooled again in the −30° C. drybox freezer. The gas inlet of the cold insert was covered with electrical tape and the insert was sealed with a greased cap and removed from the drybox atmosphere. Outside of the drybox, the tube was placed in a plastic bag. The bag was sealed, placed in a bucket and surrounded with dry ice. After removing the electrical tape, the glass insert was transferred to a pressure tube. The pressure tube was sealed, evacuated, placed under ethylene 150 psi) and shaken mechanically for approximately 18 h at room rt. Following the completion of the reaction, methanol (~20 mL) was added to the glass insert in order to precipitate the polymer. The copolymer was isolated and dried under vacuum to yield 1.75 g of a white powder. $^{13}$C NMR spectra was obtained unlocked at 140° C. using 310 mg of sample and 60 mg CrAcAc in a total volume of 3.1 mL TCB using a Varian Unity 400 NMR spectrometer with a 10 mm probe. $^{13}$C NMR: 2.14 mole % norbornene-HFIP incorporated in the branched ethylene copolymer.

Examples 7–17

The following catalysts identified as N-1 to N-4 were made in accordance with the synthesis described in Examples 22–25.

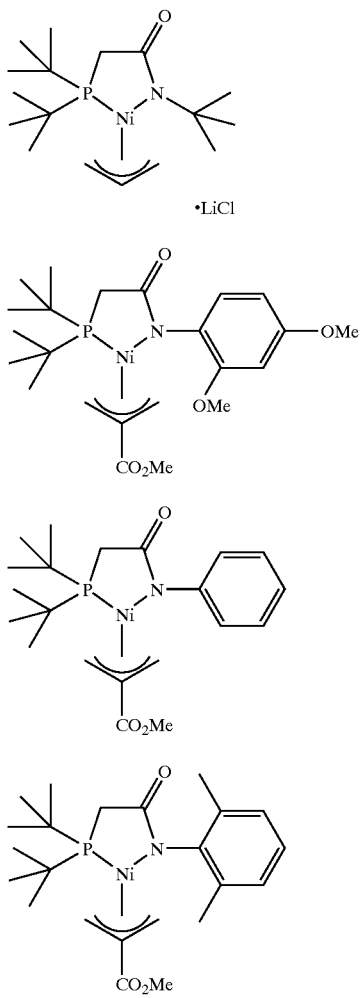

-continued

NRBF
(endo/exo)

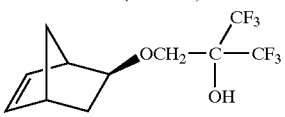

NBFOH
(exo)

Procedure for Examples 7–17

In a nitrogen-purged drybox, a glass insert was loaded with the nickel compound and B(C$_6$F$_5$)$_3$ and, optionally, NaBAF. Next, p-xylene was added to the glass insert followed by the addition of NRBF or NBFOH. The insert was greased and capped. The glass insert was then loaded in a pressure tube inside the drybox. The pressure tube was then sealed, brought outside of the drybox, connected to the pressure reactor, placed under the desired ethylene pressure and shaken mechanically. After the stated reaction time, the ethylene pressure was released and the glass insert was removed from the pressure tube. The polymer was separated into methanol-soluble and -insoluble fractions by the addition of MeOH (~20 mL). The insoluble fraction was collected on a frit and rinsed with MeOH. The MeOH was then removed in vacuo to give the MeOH-soluble fraction. The polymers were transferred to pre-weighed vials and dried under vacuum overnight. The polymer yield and characterization were then obtained.

NMR Characterization. $^1$H NMR spectra were obtained at 113° C. in TCE-d$_2$ using a Bruker 500 MHz spectrometer. $^{13}$C NMR spectra were obtained unlocked at 140° C. using 310 mg of sample and 60 mg CrAcAc in a total volume of 3.1 mL TCB using a Varian Unity 400 NMR spectrometer or a Bruker Avance 500 MHz NMR spectrometer with a 10 mm probe. Total methyls per 1000 CH$_2$ were measured using different NMR resonances in $^1$H and $^{13}$C NMR spectra. Because of accidental overlaps of peaks and different methods of correcting the calculations, the values-measured by $^1$H and $^{13}$C NMR spectroscopy will not be exactly the same, but they will be close, normally within 10–20% at low levels of comonomer incorporation. In $^{13}$C NMR spectra, the total methyls per 1000 CH$_2$ are the sums of the 1B$_1$, 1B$_2$, 1B$_3$, and 1B$_{4+}$, EOC resonances per 1000 CH$_2$. The total methyls measured by $^{13}$C NMR spectroscopy do not include the minor amounts of methyls from the methyl vinyl ends. In $^1$H NMR spectra, the total methyls are measured from the integration of the resonances from 0.6 to 1.08 ppm and the CH$_2$'s are determined from the integral of the region from 1.08 to 2.49 ppm. It is assumed that there is 1 methine for every methyl group, and ⅓ of the methyl integral is subtracted from the methylene integral to remove the methine contribution.

Molecular Weight Characterization. GPC molecular weights are reported versus polystyrene standards. Unless noted otherwise, GPC's were run with RI detection at a flow rate of 1 mL/min at 135° C. with a run time of 30 min. Two columns were used: AT-806MS and WA/P/N 34200. A Waters RI detector was used and the solvent was TCB with 5 grams of BHT per gallon. In addition to GPC, molecular weight information was at times determined by $^1$H NMR spectroscopy (olefin end group analysis) and by melt index measurements (g/10 min at 190° C.).

TABLE 1

Ethylene/NRBF Copolymerizations (Total Volume NRBF + p-Xylene = 10 mL; 150 psi Ethylene; 205 mg B(C$_6$F$_5$)$_3$; 18 h)

| Ex | Cmpd (mmol) | Temp ° C. | NRBF mL | Yield[a] g | NRBF Incorp mol % | M.W. | Total Me |
|---|---|---|---|---|---|---|---|
| 7 | N-1 (0.04) | 60 | 4 | 2.64 | 3.08 ($^{13}$C) | M$_p$ = 16,574; M$_w$ = 17,428; M$_n$ = 4,796; PDI = 3.63 | 24.0 ($^{13}$C) |
| 8 | N-1 (0.04) | 60 | 2 | 4.12 | 1.57 ($^{13}$C) | M$_p$ = 12,408; M$_w$ = 14,206; M$_n$ = 5,798; PDI = 2.45 | 16.3 ($^{13}$C) |
| 9 | N-1 (0.04) | 90 | 4 | 3.72 | 2.34 ($^{13}$C) | M$_p$ = 7,045; M$_w$ = 7,850; M$_n$ = 2,452; PDI = 3.20 | 20.0 ($^{13}$C) |
| 10 | N-1 (0.04) | 90 | 2 | 9.19 | 2.15 ($^{13}$C) | M$_p$ = 7,599; M$_w$ = 8,085; M$_n$ = 3,313; PDI = 2.44 | 19.2 ($^{13}$C) |
| 11 | N-1 (0.04) | 120 | 4 | 14.69 | 4.80 ($^{13}$C) | | 32.0 ($^{13}$C) |
| 12 | N-1 (0.04) | 120 | 2 | 17.96 | 0.79 ($^{13}$C) | M$_p$ = 4,673; M$_w$ = 5,037; M$_n$ = 1,937; PDI = 2.60 | 15.8 ($^{13}$C) |

[a]Yield in grams of MeOH-insoluble polymer fractions. MeOH soluble polymer fractions were also-isolated for the polymerizations of Examples 7–12. The $^1$H NMR spectra and solubility of these fractions indicate that they have high NRBF incorporation (>50 mol % by $^1$H NMR analysis). The homopolymer of NRBF is typically a white powder, as is the homopolymer of ethylene made by catalyst N-1. Therefore, the appearance of these polymers as viscous oils and also their methanol-solubility is consistent with them being copolymers of NRBF and ethylene. Yield and appearance of MeOH-soluble fractions:
Example 7. 2.50 g viscous yellow oil;
Example 8. 2.11 g viscous yellow oil;
Example 9. 1 g viscous yellow oil;
Example 10. 0.34 g viscous yellow oil;
Example 11. 1.18 g viscous yellow oil;
Example 12. 0.44 g viscous yellow oil;

TABLE 2

Ethylene/NBFOH Copolymerizations (Total Volume NBFOH + p-Xylene = 10 mL; 50 psi Ethylene; 90° C.; 205 mg B(C$_6$F$_5$)$_3$; 177 mg NaBAF; 18 h)

| Ex | Cmpd (mmol) | NBFOH mL | Yield[a] g | NBFOH Incorp mol % | M.W. | Total Me |
|---|---|---|---|---|---|---|
| 13 | N-2 (0.04) | 2 | 0.431 | 0.56 ($^{13}$C) | M$_n$($^1$H) = 4,370 | 12.1 ($^{13}$C) |
| 14 | N-3 (0.04) | 2 | 0.301 | 0.05 ($^1$H) | M$_n$($^1$H) = 2,942 | 12.7 |
| 15 | N-4 (0.04) | 2 | 0.119 | Trace ($^1$H) | | |
| 16 | N-1 (0.04) | 2 | 1.07 | 0.75 ($^{13}$C) | M$_n$($^1$H) = 2,560 | 14.4 ($^{13}$C) |
| 17 | N-1 (0.04) | 4 | 1.46 | 0.85 ($^{13}$C) | | 130.4 ($^{13}$C) |

[a]Yield in grams of MeOH-insoluble polymer fractions. MeOH soluble polymer fractions were also isolated for the polymerizations of Examples 13–17. The solubility of these fractions indicates that they have high NBFOH incorporation. The homopolymer of NBFOH is typically a white powder, as is the homopolymer of ethylene made by catalysts N-1 through N-4. Therefore, the appearance of these polymers as viscous oils/amorphous solids and also their methanol-solubility is consistent with them being copolymers of NBFOH and ethylene. Yield and appearance of MeOH-soluble fractions:
Example 13. 1.12 g brown oil/solid:
Example 14. 0.98 g yellow oil/solid;
Example 15. 1 g tan oil/solid;
Example 16. 1.03 g tan oil/solid;
Example 17. 1.27 g brown oil/solid.

TABLE 3

$^{13}$C NMR Branching Analysis for Some Ethylene Copolymers (MeOH-Insoluble Fractions) of NRBF and NBFOH

| Ex | Total Me | Me | Et | Pr | Bu | Hex+ & eoc | Am+ & eoc | Bu+ & eoc |
|---|---|---|---|---|---|---|---|---|
| 1 | 23.3 | 13.1 | 3.2 | 0.6 | 0.9 | 5.3 | 5.6 | 6.4 |
| 2 | 39.3 | 31.3 | 2.8 | 1.3 | 0.8 | 1.4 | 2.3 | 3.9 |
| 4 | 50.5 | 37.2 | 5.0 | 1.5 | 1.4 | 4.1 | 5.2 | 6.8 |
| 5 | 50.5 | 18.5 | 6.3 | 0.8 | 2.6 | 16.8 | 21.2 | 24.9 |
| 6 | 30.7 | 12.3 | 4.0 | 0.7 | 1.2 | 9.1 | 11.6 | 13.8 |
| 7 | 24.0 | 17.2 | 2.1 | 0.2 | 0.6 | 2.5 | 4.4 | 4.4 |
| 8 | 16.3 | 10.2 | 2.2 | 0.3 | 0.5 | 2.7 | 4.3 | 3.6 |
| 9 | 20.0 | 10.8 | 1.7 | 0.4 | 0.8 | 4.5 | 6.6 | 7.1 |
| 10 | 19.2 | 9.8 | 1.1 | 0.1 | 0.6 | 5.3 | 7.1 | 8.2 |
| 11 | 32.0 | 20.6 | 0.0 | 0.5 | 0.8 | 7.0 | 10.1 | 11.0 |
| 12 | 15.8 | 3.7 | 0.0 | 0.4 | 0.9 | 8.6 | 8.8 | 11.7 |
| 13 | 12.1 | 6.8 | 0.3 | 0.1 | 1.8 | 4.5 | 4.4 | 4.9 |
| 16 | 14.4 | 5.6 | 0.8 | 0.1 | 1.2 | 5.9 | 5.3 | 7.8 |
| 17 | 130.4 | 110.4 | 7.3 | 1.2 | 35.6 | 9.2 | 13.1 | 11.5 |

TABLE 4

GPC Data for Ethylene/NRBF Copolymers of Examples 5 and 6

| Ex | M$_w$ | M$_n$ | M$_p$ | PDI |
|---|---|---|---|---|
| 5 | 4,892 | 427 | 364 | 11.47 |
| 6 | 111,129 | 915 | 495 | 121.41 |

Example 18

Example 6 was repeated with the exception that the procedure and methods used for Examples 7–17 were followed. That is, the methanol-soluble polymer fraction was isolated as well as the methanol-insoluble polymer fraction. NRBF owas used as the comonomer.

The yield of the methanol-insoluble fraction was 0.19 g. The yield and characterization of the methanol-soluble fraction was 0.75 g:29.61 mole percent NRBF incorporation; 44.7 Me/1000 CH$_2$; Mn:No olefins.

Example 19

The following solution was prepared and magnetically stirred overnight.

| Component | Wt. (gm) |
|---|---|
| The methanol-soluble fraction of the copolymer in Example 9 | 0.192 |
| 2-Heptanone | 2.134 |
| t-Butyl Lithocholate | 0.050 |
| 6.82% (wt) solution of triphenylsulfonium nonaflate dissolved in 2-heptanone which had been filtered through a 0.45μ PTFE syringe filter. | 0.125 |

Spin coating was done using a Brewer Science Inc. Model-100CB combination spin coater/hotplate on a 4 in. diameter Type "P", <100> orientation, silicon wafer Development was performed on a Litho Tech Japan Co. Resist Development Analyzer (Model-790).

The wafer was prepared by depositing 6 mL of hexamethyldisilazane (HMDS) primer and spinning at 5000 rpm for 10 seconds. Then about 1 mL of the above solution, after filtering through a 0.45 μm PTFE syringe filter, was deposited and spun at 2500 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm$^2$. By using a mask with 18 positions of varying neutral optical density, a wide variety of exposure doses were generated. After exposure the exposed wafer was baked at 100° C. for 60 seconds.

The wafer was developed in aqueous tetramethylammonium hydroxide (TMAH) solution (OHKA NMD-W, 2.38% TMAH solution) for approximately 2 seconds. This test generated a positive image with a clearing dose of 2.7 mJ/cm$^2$.

Example 20

The following solution was prepared and magnetically stirred overnight.

| Component | Wt. (gm) |
|---|---|
| The methanol-soluble fraction of the copolymer in Example 9 | 0.142 |
| 2-Heptanone | 2.134 |
| t-Butyl Lithocholate | 0.100 |
| 6.82% (wt) solution of triphenylsulfonium nonaflate dissolved in 2-heptanone which had been filtered through a 0.45μ PTFE syringe filter. | 0.125 |

The wafer coating, imaging and developing procedure as described in Example 19 was followed except the development time was for 60 seconds. This test generated a positive image with a clearing dose of 8.3 mJ/cm$^2$.

Example 21

The following solution was prepared and magnetically stirred overnight.

| Component | Wt. (gm) |
|---|---|
| The methanol-soluble fraction of the copolymer in Example 18 | 0.142 |
| 2-Heptanone | 2.134 |
| t-Butyl Lithocholate | 0.100 |
| 6.82% (wt) solution of triphenylsulfonium nonaflate dissolved in 2-heptanone which had been filtered through a 0.45μ PTFE syringe filter. | 0.125 |

The wafer coating procedure as described in Example 19 was followed. A photoresist film of suitable quality was formed on the substrate. However, the quantity of polymer was insufficient to permit a determination of the proper settings for image formation.

General Methods and Information for Ligand Precursor and Catalyst Syntheses for Examples 22–25

All operations related to the catalyst syntheses were performed in a nitrogen-purged drybox. Anhydrous, de-oxygenated solvents were used in all cases and were either purchased as such from Aldrich or were purified by standard methods. The solvents were then stored over 4 Å molecular sieves in the drybox. NaBAF was purchased from Boulder Scientific and Ni[II] allyl halide precursors were prepared according to standard literature methods. (Tert-butyl)$_2$PCH$_2$Li was synthesized by reacting (tert-butyl)$_2$PCH$_3$ (purchased from Strem) with equimolar tert-butyl lithium (purchased from Aldrich) in heptane at 109° C. for a few hours. The product was collected on a frit and washed with pentane. NMR spectra were recorded using a Bruker 500 MHz spectrometer or a Bruker 300 MHz spectrometer.

Example 22

Synthesis of N-1. A 500 mL round-bottom flask was charged with 536 mg (5.40 mmol) of t-butylisocyanate dissolved in ca. 30 mL of THF. Then (t-Bu)$_2$PCH$_2$Li (898 mg, 5.40 mmol) dissolved in ca. 30 mL of THF was added. The reaction mixture was stirred for one hour. Next, a solution of [Ni(C$_3$H$_5$)(μ-Cl)]$_2$ (730 mg, 2.70 mmol) in THF (ca. 30 mL) was added, and the reaction mixture was stirred for an additional one hour and the solvent was then removed in vacuo. The residue was washed with hexane and dried in vacuo to yield 1.80 g (83%) of a purple powder. $^1$H NMR (CD$_2$Cl$_2$, 23° C., 300 MHz): δ 6.0–4.0 (broad signals), 4.0–2.0 (broad signals), 1.0–0.0 (broad signals, t-Bu); $^{31}$P NMR (CD$_2$Cl$_2$, 23° C., 300 MHz): δ 46.7 (s).

Example 23

Synthesis of N-2. 2,4-Dimethoxyphenylisocyanate (1.078 g) and (t-Bu)$_2$PCH$_2$Li (1.00 g) were weighed in separate vials. Approximately 5 mL of THF was added to each vial and the vials were capped and cooled to −30° C. in the drybox freezer. The cold (t-Bu)$_2$PCH$_2$Li solution was added to the cold 2,4-dimethoxyphenylisocyanate solution and the reaction mixture was stirred overnight. The solution was filtered and the THF was removed in vacuo. The product was washed with toluene, leaving behind the lithium salt of the ligand as 0.67 g of a cream powder: $^{31}$P NMR (C$_6$D$_6$) δ 6.69 and 0.00. This lithium salt of the ligand (0.43 g), [(H$_2$CC(CO$_2$Me)CH$_2$)Ni(μ-Br)]$_2$ (0.27 g) and NaBAF (1.00 g) were then placed in a round bottom flask and dissolved in about 20 mL of Et$_2$O. The reaction mixture was stirred overnight. The product was filtered through a frit with dry diatomaceous earth. The solvent was removed and the product was dried in vacuo to give N-2 together with 1 equiv of (Li/Na) BAF as 1.46 g of an orange-brown powder: $^{31}$P NMR (CD$_2$Cl$_2$) 60.1 (major); 62.1 (minor).

Example 24

Synthesis of N-3. Phenyl isocyanate (0.22 g) and 0.30 g of (t-Bu)$_2$PCH$_2$Li were weighed in separate vials. Approximately 3 mL of THF was added to each vial. The phenyl isocyanate solution was added to the solution of (t-Bu)$_2$PCH$_2$Li and the reaction mixture was stirred overnight. The next day, [(H$_2$CC(CO$_2$Me)CH$_2$)Ni($\mu$-Br)]$_2$ (0.43 g) was weighed in a separate vial and dissolved in several mL of THF. The resulting solution was added to the reaction mixture, which was then stirred overnight again. The solvent was removed in vacuo. The product was dissolved in toluene and filtered. The solvent was removed and the product was dried in vacuo to give 0.53 g of a red powder: $^{31}$P NMR (C$_6$D$_6$) δ 54.1 (major).

Example 25

Synthesis of N-4. 2,6-Dimethylphenyl isocyanate (0.27 g) and 0.30 g of (t-Bu)$_2$PCH$_2$Li were weighed in separate vials. Approximately 3 mL of THF was added to each vial. The 2,6-dimethylphenyl isocyanate solution was added to the solution of (t-Bu)$_2$PCH$_2$Li and the reaction mixture was stirred overnight. The next day, [(H$_2$CC(CO$_2$Me)CH$_2$)Ni($\mu$-Br)]$_2$ (0.43 g) was weighed in a separate vial and dissolved in several mL of THF. The resulting solution was added to the reaction mixture, which was then stirred overnight again. The solvent was removed in vacuo. The product was dissolved in Et$_2$O and filtered through a frit with diatomaceous earth. The solvent was removed and the product was dried in vacuo to yield 0.75 g of a red-brown powder: $^{31}$P NMR (C$_6$D$_6$) δ 51.7 (major).

What is claimed is:

1. A photoresist composition comprising:
   a fluorine-containing polymer prepared from at least
   (A) a spacer group selected from the group consisting CH$_2$=CH$_2$, alpha-olefins, 1,1'-disubstituted olefins, vinyl alcohols, vinyl ethers, and 1,3-dienes; and
   (B) a repeat unit derived from a monomer having the following structure:

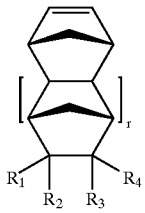

wherein each of R$_1$, R$_2$, R$_3$, and R$_4$ independently is hydrogen, a halogen atom, a hydrocarbon group containing from 1 to 10 carbon atoms, a substituted hydrocarbon group, an alkoxy group, a carboxylic acid, a carboxylic ester or a functional group containing the structure:

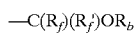

—C(R$_f$)(R$_f$')OR$_b$ wherein R$_f$ and R$_f$' are the same or different fluoroalkyl groups of from 1 to 10 carbon atoms or taken together are (CR$_2$)$_n$ wherein n is 2 to 10; R$_b$ is hydrogen or an acid- or base-labile protecting group; r is 0–4; at least one of the repeat units (B) has a structure whereby at least one of R$_1$, R$_2$, R$_3$, and R$_4$ contains the structure C(R$_f$)(R$_f$')OR$_b$, and (b) at least one photoactive component, wherein the fluorine-containing polymer has an absorption coefficient of less than 4.0 μm$^{-1}$ at a wavelength of 157 nm, and wherein the photoactive component is chemically bonded to the fluorine-containing polymer.

2. A process for preparing a photoresist image on a substrate comprising, in order:

(X) imagewise exposing the photoresist layer to form imaged and non-imaged areas wherein the photoresist layer is prepared from a photoresist composition comprising;
   (a) a fluorine-containing polymer prepared from at least
      (A) a spacer group selected from the group consisting of CH$_2$=CH$_2$, alpha-olefins, 1,1'-disubstituted olefins, vinyl, alcohols, vinyl ethers, and 1,3-dienes; and
      (B) a repeat unit derived from a monomer having the following structure:

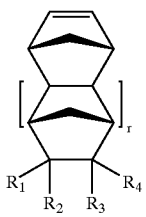

wherein each of R$_1$, R$_2$, R$_3$, and R$_4$ independently is hydrogen, a halogen atom, a hydrocarbon group containing from 1 to 10 carbon atoms, a substituted hydrocarbon group, an alkoxy group, a carboxylic acid, a carboxylic ester or a functional group containing the structure:

–C(R$_f$)(R$_f$')OR$_b$ wherein R$_f$ and R$_f$' are the same or different fluoroalkcyl groups of from 1 to 10 carbon atoms or taken together are (CF$_7$) wherein n is 2 to 10; R$_b$ is hydrogen or an acid- or base-labile protecting group; r is 0–4; at least one of the repeat units (B) has a structure whereby at least one of R$_1$, R$_2$, R$_3$, and R$_4$ contains the structure C(R$_f$)(R$_f$')OR$_b$; and (b) at least one photoactive component wherein the fluorine-containing polymer has an absorption coefficient of less than 4.0 μm$^{-1}$ at a wavelength of 157 nm; and (Y) developing the exposed photoresist layer having imaged and non-imaged areas to form the relief image on the substrate, wherein the photoactive component is chemically bonded to the fluorine-containing polymer.

* * * * *